United States Patent [19]

Crosby et al.

[11] 4,250,210

[45] Feb. 10, 1981

[54] CHEMICAL VAPOR DEPOSITION

[75] Inventors: Jeffrey N. Crosby, Kidderminster; Robert S. Hanley, Stoke Prior, both of England

[73] Assignee: The International Nickel Co., Inc., New York, N.Y.

[21] Appl. No.: 864,820

[22] Filed: Dec. 27, 1977

Related U.S. Application Data

[63] Continuation-in-part of Ser. No. 685,426, May 11, 1976, abandoned.

[51] Int. Cl.$^3$ ............................................. C23C 11/02
[52] U.S. Cl. ................................... 427/252; 427/255; 427/294
[58] Field of Search ............... 427/229, 252, 294, 255; 29/198; 428/457, 253

[56] References Cited

U.S. PATENT DOCUMENTS

| | | | |
|---|---|---|---|
| 3,071,493 | 1/1963 | Whaley et al. | 427/252 |
| 3,259,678 | 7/1966 | Davis | 427/252 |
| 3,294,654 | 12/1966 | Norman et al. | 427/252 |
| 3,356,527 | 12/1967 | Moshier et al. | 427/253 |

FOREIGN PATENT DOCUMENTS

| | | |
|---|---|---|
| 1147101 | 4/1963 | Fed. Rep. of Germany ........... 427/252 |
| 990174 | 4/1965 | United Kingdom . |
| 1151938 | 5/1969 | United Kingdom . |
| 1251631 | 10/1971 | United Kingdom . |
| 1399237 | 6/1975 | United Kingdom . |

*Primary Examiner*—Morris Kaplan
*Assistant Examiner*—Janyce A. Bell
*Attorney, Agent, or Firm*—R. J. Kenny; F. J. Mulligan, Jr.

[57] ABSTRACT

A process for chemical vapor deposition of ruthenium on heat resistant substrates employing ruthenium 1, 3 dione compounds as volatile sources and causing the volatile material to impact on a heated receiving substrate in random fashion in a quiescent, low-pressure atmosphere.

4 Claims, 1 Drawing Figure

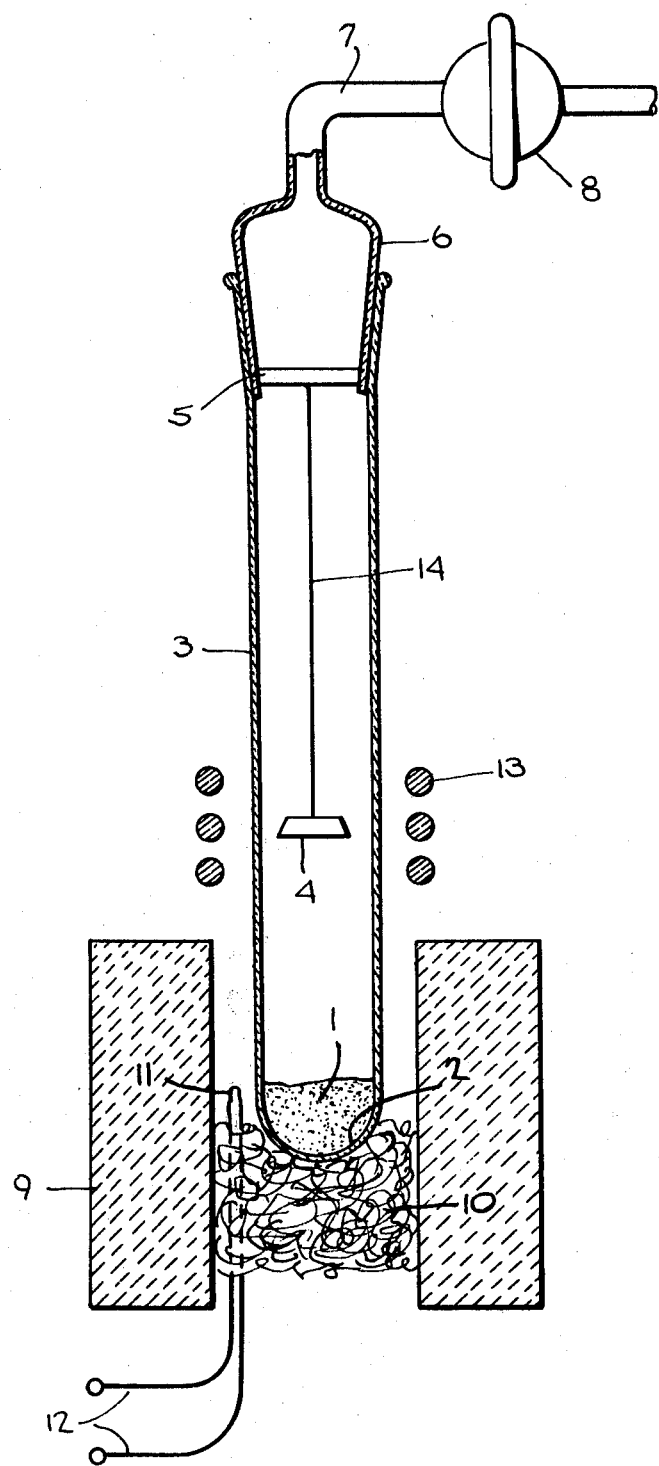

CHEMICAL VAPOR DEPOSITION

This is a continuation-in-part of U.S. Ser. No. 685,426, filed May 11, 1976, now abandoned.

The present invention relates to the deposition of ruthenium, in particular by the so-called chemical vapor deposition method.

In a chemical vapor deposition method ruthenium may be deposited on a surface of a substrate by heating the surface and decomposing the vapor of a ruthenium compound on the hot surface. Various ruthenium compounds, such as ruthenium carbonyl chloride, ruthenium penta (trifluorophosphine) [Ru (PF$_3$)$_5$] and ruthenocene have been proposed as sources of the vapor. However, these compounds are unsuitable for general use because the rates of deposition of ruthenium that can be obtained are very low, i.e., of the order of 0.2 $\mu$m (micro-meters) average thickness per hour ($\mu$m/h), and so can only really be used to deposit thin coatings. Indeed, it is often difficult to produce from these compounds even thin deposits which adhere to the substrate. Furthermore, the compounds are often difficult or expensive to prepare, and some of them corrode the substrate. For example, ruthenocene and ruthenium penta (trifluorophosphine) are both difficult, and therefore expensive to prepare. Ruthenium carbonyl chloride corrodes some substrates and is also difficult to prepare because it is difficult to obtain a consistent product, and this lack of consistency in the product can show up as a substantially involatile form of the carbonyl chloride, which decomposes before it can volatilize.

Because of the foregoing difficulties in chemical vapor depositing ruthenium, attempts have been made to deposit ruthenium by other routes, for example, by electrodeposition. It has been proposed to electrodeposit ruthenium, osmium, or an alloy of these two elements on to at least the surfaces adjacent to the cutting edge or each such edge of a tool suitable for cutting metal or other material, such as rock, to increase the cutting life of the tool. However, electrodeposition has the disadvantage that the surface to be coated has to be thoroughly cleaned and, usually, etched. Further, because many ruthenium electroplating baths are very acid, it may be necessary to protect the surface to be coated by first giving it a flash coating of an acid-resistant metal, such as gold or palladium. The gold or palladium does not substantially add to the cutting life of the tool, but does add to the expense of the process.

The coating of ruthenium on the tool should generally be at least 2 $\mu$m (micro-meters) in average thickness. The methods of chemical vapor deposition referred to hereinbefore are unsuitable for depositing such a coating, especially as the deposition rates are too low for the thickness required.

However, we have surprisingly found a process for depositing ruthenium, which makes it possible to deposit ruthenium on a substrate at a rate which can be at least three times faster than earlier processes, is, once established, relatively constant as time passes, and is great enough to be suitable for commercial manufacture of relatively thick, even coatings of ruthenium over all faces of a substrate.

It is an object of the present invention to provide a novel process for vapor depositing ruthenium.

Another object of the present invention is to provide a process for rapidly depositing ruthenium from a vapor containing a chemically combined form of ruthenium.

A still further object of the invention is to provide novel cutting tools having a hard, cobalt-bonded carbide substrate and a superficial layer enriched in ruthenium deposited by the process of the present invention.

Other objects and advantages will become apparent from the following description taken in conjunction with the drawing which shows a schematic diagram of experimental apparatus used to carry out the process of the present invention.

According to the present invention there is provided a process in which metallic ruthenium is deposited on a hot substrate by decomposing thereon, in a substantially static partial vacuum, and at a substantially constant pressure vapor of a complex of ruthenium with a 1, 3 dione compound of formula R$_1$—CO—CH-R$_2$—CO—R$_3$, wherein each of R$_1$ and R$_3$, which may be the same or different, is an alkyl, haloalkyl, alkoxy, aryl, (e.g., phenyl), or alkyl- nitro-, or halo-substituted aryl (e.g., phenyl) group and R$_2$ is a hydrogen atom or an alkyl or haloalkyl group.

The 1, 3 dione compound (alternatively known as a beta dicarbonyl compound) from which the complex is derived must have at least one hydrogen atom on the 2-carbon atom, as can be seen from its formula. Preferably the R$_1$ and R$_3$ groups are alkyl or haloalkyl, especially alkyl or perfluoroalkyl. Preferably R$_2$ is a hydrogen atom. In an especially preferred 1, 3 dione compound for complexing with the ruthenium R$_1$ and R$_3$ are the same and are both methyl groups, and R$_2$ is a hydrogen atom, the compound being acetylacetone (pentan-2, 4-dione), which is readily available and relatively inexpensive. Other preferred 1, 3 dione compounds are trifluoro (acetylacetone) (CF$_3$.CO.CH$_2$.CO.CH$_3$) and hexa-fluoro (acetyl-acetone) (CF$_3$.CO.CH$_2$.CO.CF$_3$).

The complex of ruthenium with these 1, 3 dione compounds usually can be considered as containing one ruthenium (III) cation with three anions derived from the 1, 3 dione compound, the three anions usually being the same. For example, the complex of ruthenium with three molecules of acetylacetone is tris(acetylacetonato) ruthenium III, which is hereinafter referred to as Ru (acac)$_3$.

These complexes may generally be readily prepared. For example, Ru (acac)$_3$ may be prepared as a red crystalline powder by reacting acetylacetone with ruthenium (III) chloride, as described by G. A. Barbieri, in Atti. Acad. Linc., 23, (5) I, 336, (1914). It may be necessary to purify the complex, e.g., by recrystallization, as the presence of certain impurities may lead to the formation of non-adherent deposits of ruthenium. For example, the deposit formed at first may be black and not adhere to the substrate, and although this black deposit can be coated with a metallic coating, the deposit as a whole does not adhere to the substrate. Alternatively, it is sometimes possible to carry out a dummy run until the black deposit is no longer formed, and then coat a fresh substrate with a deposit, which is metallic and adheres to the substrate.

In the process of the present invention there are interactions between the nature of the complex, the pressure used in the substantially static partial vacuum, and the temperatures of the source and of the substrate. These interactions will be described in more detail hereinafter.

In a preferred embodiment of the process of the present invention, the vapor of the ruthenium complex is provided by subliming a solid complex, which acts as a ruthenium source. As heating the complex can cause it to decompose without vaporising, the heating should preferably be carried out so that the solid complex is sublimed substantially without decomposition. If the complex may melt, care should be taken to reduce or avoid loss of the complex by liquid flow.

The vapor obtained by heating the complex must be decomposed in a substantially static partial vacuum. A partial vacuum can be static or dynamic. A static partial vacuum may be produced by pumping a vessel down to a desired pressure and then turning off the pump, for example, by closing a valve between the vessel and the pump, so that the vacuum is not pumped during deposition of ruthenium. A dynamic partial vacuum may be produced by pumping a vessel down to a desired pressure and continuing the pumping during deposition of the ruthenium to try to maintain the desired pressure or lower it further. By a "substantially static partial vacuum" is meant either a static partial vacuum or a dynamic partial vacuum in which the conditions are in substance the same as in a static partial vacuum; for example, the pumping is only very gentle. Preferably the partial vacuum is a static partial vacuum, which is not pumped at all during deposition of ruthenium. A dynamic partial vacuum either produces no deposit or one very slowly, so that in practice only thin coatings can be obtained using a dynamic partial vacuum. If a dynamic partial vacuum is used the throwing power of the deposition process is very poor and most of any deposit formed appears on faces of the substrate nearest to the source of the vapor. In contrast, if a static vacuum is used, the throwing power is good and a more or less uniform coating is deposited over all faces of the substrate. We believe, but do not wish to be bound by this belief, that it is impressed motion of the vapor past the substrate caused by the pumping that is important. The smaller this impressed motion is the better; in an unpumped partial vacuum it will be substantially nil.

Pressures quoted in this specification were measured in the following manner. The volume was pumped down to the required pressure and the pressure taken as that measured by a McLeod gauge just before the volume was closed and before heating commenced. A McLeod gauge is a vacuum pressure gauge in which a sample of low-pressure gas is compressed in a known ratio until its pressure can be measured reliably. For pressures high enough to be reliably measured directly by a mercury manometer, the McLeod gauge can be replaced by a mercury manometer. Other methods of measuring the pressure may be used, in which case allowance must be made for any way in which these measurements may differ from those obtained with a McLeod gauge (or mercury manometer) and unheated gas.

The maximum pressure that can be used in the substantially static partial vacuum depends upon the volatility of the complex and its decomposition temperature. The lower the decomposition temperature, the lower is the temperature that should be used for the volatilization. At a given volatilization temperature, the lower the pressure used, the greater is the volatilization of the complex. Therefore, the pressure must be chosen so as to give, at a temperature below the decomposition temperature, a volatilization rate for the complex sufficient to provide a ruthenium deposit on the substrate at the desired rate. For example, with Ru (acac)$_3$ a visible deposit is slowly formed at a pressure of about 100 mm (millimeters) of mercury (100 torr) using a volatilisation temperature of 210° C. and substrate (decomposition) temperature of 580° C. At a pressure of 10 torr the rate is under otherwise the same conditions, about 4 $\mu$m/h. The pressure is preferable no more than 0.5 torr and is preferably $10^{-2}$ to $10^{-3}$ torr as under a pressure of about $10^{-2}$ torr, and otherwise the same conditions, a coating rate of about 15 $\mu$m/h can be obtained. There is no lower limit to the pressure, but the vacuum is always only partial as there is always some vapor of ruthenium complex present during deposition. With a more volatile complex it would probably be possible to operate at an even higher pressure than 100 torr. Apart from vapor of the complex, inert gases, such as nitrogen, may be present and also low pressures of gases such as air may be present. For example, at pressures of about $10^{-1}$ to $10^{-3}$ torr, air may be present with the vapor.

As regards vaporization of the source, the more volatile the complex used as source, the lower can be the temperature of the source. For a given ruthenium source and pressure there is usually a range of suitable source temperatures to provide the necessary volatilization, and for a given volatilization temperature there is an upper limit to the suitable pressures as can be seen hereinbefore with respect to Ru(acac)$_3$ at a source temperature of 210° C. The maximum source temperature depends on how much decomposition can be tolerated, as well as on the pressure and the complex used.

Once deposition is initiated, a steady state exists with respect to pressure because, surprisingly, non-metallic reaction products condense as a viscous liquid on the inner surface of the reaction vessel near the heated substrate. We believe, but do not wish to be bound by this belief, that, because the process of the invention is not carried out in the presence of a substantial amount of hydrogen gas, the decomposition of the Ru(acac)$_3$ does not lead to the formation of substantial amounts of acetylacetone. The high viscosity of the liquid condensing on the inner surface of the reaction vessel suggests that the liquid is polymeric, possibly a dimer or a higher polymer of the acac radical. Although we do not know the mechanism by which the viscous liquid is formed, we think that it is possible that the acac radicals, which are presumably initially formed when the Ru(acac)$_3$ decomposes, are stabilised by internal electronic resonance to an extent such that the radicals polymerise before they can decompose, this polymerisation being assisted by contact with a ruthenium surface which may be catalytically active. Regardless of the true explanation of its formation, the viscous liquid has a very low vapour pressure when condensed and so the internal pressure in the reaction vessel is essentially related to the vapor pressure of the source material as it is volatilizing.

The deposition rate increases with increase in volatilization. For example, using a Ru (acac)$_3$ source, a pressure of $10^{-2}$ to $10^{-3}$ torr and a substrate temperature of about 500° C., a source temperature of about 140° C. produces detectable vaporization, but insufficient to form a deposit. Using the same pressure, substrate temperature and source, source temperatures of about 150° to 180° C. give moderate deposition rates of 1 to 2 $\mu$m/h (micrometers average thickness per hour). The optimum source temperature is from 200° to 210° C., e.g., 200° to 205° C., which at a substrate temperature for example of 500° C. can give a deposition rate of up to 15 $\mu$m/h, e.g., up to 6 $\mu$m/h, respectively. Preferably, the conditions of the deposition are chosen so as to produce a coating rate of at least 10 μm/h. At about 215° C. the Ru(acac)$_3$ shows signs of melting and of decomposing. Higher temperatures can be used but there is an increasing penalty incurred by decomposition of the source. The optimum temperature for Ru (acac)$_3$ is about 210° C. at which the rate is about 15 μm/h or higher. The complex Ru(CH$_3$.CO.CH.CO.CF$_3$)$_3$ is more volatile than Ru(acac)$_3$ and so a lower source temperature can be used, the optimum temperature being about 130° to 150° C. Source temperatures quoted in this specification are as measured by a thermocouple placed outside the vessel containing the source and close to the source within the heated space.

The vapor produced by the source diffuses to the substrate down a concentration gradient between the source and the substrate. During diffusion the vapor may come into contact with a wall of the containing vessel, where it may condense or even decompose. The wall is preferably maintained at a suitable temperature so that the vapor neither condenses nor decomposes on the wall.

The vapor of the complex should decompose on the surface of the substrate if the ruthenium formed is to form part of an adherent coating. To promote adherence of the coating, the substrate should be clean and free of grease. This cleaning may be readily done with carbon tetrachloride, for example.

The temperature of the substrate must be high enough to be capable of decomposing the vapor of the complex and thus depends on the thermal stability of the complex. Generally speaking, the higher the substrate temperature, the faster is the decomposition of the complex, but there is, however, an upper limit to the substrate temperature. This upper limit arises because, when the substrate becomes too hot, it can decompose the vapor before the vapor reaches the surface of the substrate. Very little, if any, of the ruthenium formed in this way away from the surface becomes incorporated in an adherent coating on the substrate. Consequently, the upper limit of substrate temperature is reached when such decomposition away from the substrate surface prevents sufficient vapor from reaching the surface to form a deposit at the desired rate. Preferably, the substrate temperature is such that decomposition away from the surface is minimized or nil, i.e., substantially all the ruthenium in the vapor of the ruthenium complex decomposed by the substrate is deposited on the substrate. The suitable range of substrate temperatures depends on the complex and substrate used. For Ru (acac)$_3$, the preferred range is 550° to 650° C., with the optimum temperature being about 580° C. For the complex Ru(CH$_3$.CO.CH.CO.CF$_3$)$_3$, which is thermally more stable than Ru(acac)$_3$, a higher substrate temperature is required, the optimum being about 700° to 750° C. The suitability of a given substrate temperature depends to some extent on the apparatus. The closer the wall of the apparatus is to the substrate, the cooler should be the substrate to avoid heating the wall to a temperature high enough to decompose the complex on the wall. For this reason, the substrate is usually suspended in the apparatus so that it is away from the walls.

The temperature of the substrate should usually be higher than that of the wall and so the substrate should be heated accordingly. With wall of glass or other material not heated by radio-frequency induction and a substrate of metal, e.g., a sintered carbide tool insert, or of other material capable of being heated by radio-frequency induction, a preferred method of heating the substrate is by radio-frequency induction heating, as this does not heat the walls substantially. The temperature of the substrate is conveniently measured by an infrared thermometer.

The deposit of ruthenium produced by the decomposition of the complex is metallic in appearance and adheres to the substrate, provided, as has been mentioned hereinbefore, the complex is substantially pure.

The thickness of the deposit, which is usually substantially uniform, is usually measured as an average by a weighing method. The substrate is weighed before and after coating, the difference being the weight of ruthenium deposited. To give the average thickness of the deposit, this weight may then be divided by the density of ruthenium (12.4 kilograms/cubic decimeter, kg/dm$^3$) (gives the volume of ruthenium) and by the area coated. The process of the present invention may be used to produce coatings up to 10 μm average thickness, or even thicker.

The decomposition of the complex produces decomposition products derived from the organic part of the complex. These decomposition products contaminate the partial vacuum but do not, in general, interfere with the decomposition because, in the main, they condense on the reactor walls. Pressures referred to in this specification in the substantially static vacuum are initial pressures, no account generally being taken of small changes in pressure caused by the decomposition. The pumping out of the apparatus in preparation for another deposition run is generally sufficient to prevent the decomposition products from interfering with the deposition. If necessary, the apparatus may be purged, for example with nitrogen, to remove them.

Any substrate, which is solid at the temperature used in decomposing the complex, may be used, for example, glass or diamond. However, the substrate is preferably metal, especially a metallic face or faces adjacent to a cutting edge, or each cutting edge, of a cutting tool. Such tools include drills, such as rock drills, cutting tips, e.g., for cutting metals, or any other tools having one or more cutting edges, and are hereinafter referred to as "cutting tools" for simplicity. The cutting edge and parts of rake and flank faces of a cutting tool are working surfaces which are subject in use to considerable wear, which limits the cutting life of the tool.

It has now been found surprisingly that such cutting tools when coated by the process of the invention show, in use, less flank wear than tools coated with ruthenium by the electrodeposition process referred to hereinbefore.

Because of this reduced flank wear, tools coated by the present process are expected to show, under equivalent working conditions, longer life than tools coated by the electrodeposition process, as flank wear is often a cause of failure of tools coated by electrodeposition, and, also, of uncoated tools. Similarly, tools coated by the present process are expected to be able to withstand, for a given life, more stringent operating conditions than tools coated by electrodeposition.

The cutting tool or, frequently, only its metallic cutting part, may be made of hard metal, high speed steel or any other suitable material. The hard metal contains a carbide or carbides which may be any of those commonly used in the production of tools, for example those hard metal grades consisting of substantially only tungsten carbide and cobalt, and those grades using a mixture of carbides in a cobalt matrix, e.g., a mixture of tungsten and titanium carbides in cobalt, and a mixture of tungsten and titanium carbides with a mixed carbide of tantalum and niobium in cobalt.

Hard metal tools coated by the present process may be heat treated, to cause some diffusion to occur between the coating and the substrate. Diffusion may be obtained at a temperature of from 1250° to 1400° C., but a temperature of from 1300° to 1350° C. is preferred as diffusion is slow below 1300° C., and above 1350° C. some degradation of the carbide may occur. The heat treatment is preferably carried out in another apparatus from that used to deposit the ruthenium. The tool life of the coated tool is further increased by the heat treatment, e.g., by up to 3 times.

The beneficial effect of the ruthenium coating in electro-coated tools is more pronounced when cutting hard materials than with softer materials, where the beneficial effect is less. With tools coated by the present process the flank wear is reduced by a factor of up to about 3, or even more, and so tool-life is increased, for both types of material, although, again, the benefits are greater for cutting harder rather than softer materials.

Substrates coated by the present process are preferably substantially non-porous.

Further examples of substrates that may be coated by the present process are those which, like cutting tools, may be subject to wear and become heated in use. Examples of these other substrates are wire drawing dies, powder compacting or forming dies and some journal bearings.

Another possible substrate is titanium metal in the form of an electrode. A ruthenium coated titanium electrode obtained by the process of the present invention may be used as an insoluble anode in a nickel electrowinning process. For such a use the coating may be about 1 $\mu$m thick and is preferably superficially oxidized by, for example, the anodic oxidation process described in U.S. Pat. No. 3,763,002.

Other uses of the ruthenium coatings are ruthenium-coated soldering irons and ruthenium-coated electrical contacts, e.g., in reed switches. The coating may also be used decoratively, or to impart corrosion-resistance and wear-resistance.

Once deposition of ruthenium has been completed it is possible to remove the substrate, for example by dissolving it chemically. This method can be used to prepare ruthenium crucibles.

The present invention is illustrated by the following Examples.

EXAMPLE 1

An apparatus that can be used, for example, on the laboratory scale is shown in the sole FIGURE of the accompanying drawing.

Referring to the drawing, some red crystalline Ru(acac)$_3$, as ruthenium source 1, was placed in the closed end 2 of a glass tube 3. Above the ruthenium source 1, a substrate 4, which was a sintered carbide tool insert, was suspended by a copper wire 14 from a glass support rod 5.

The rod 5 was held in a cap 6 air-tightly fitted in the open end of the tube 3. From the cap 6, tubing 7 led via a turn-cock 8 to a rotary vacuum pump and a McLeod gauge (both not shown).

The region of the tube 3 containing the ruthenium source 1 was surrounded by a furnace 9 which contained some glass wool 10 on which the tube 3 rested. The temperature of the furnace and ruthenium source 1 was measured by a thermocouple 11 which was connected via wires 12 to a digital voltmeter (not shown).

The substrate 4 was heated by a heating coil 13 of a kilowatt induction furnace (not shown). The temperature of the substrate 4 was measured by an infra-red thermometer (not shown) which was focussed on the substrate from outside the tube 3.

At the start of the run the furnace 9 was in a lowered position, i.e., withdrawn from the tube 3 and below the position illustrated in the accompanying drawing.

With the turn-cock 8 open, the apparatus was pumped with the rotary vacuum pump down to an initial pressure of $10^{-2}$ torr, as measured by the McLeod gauge, and the turn-cock 8 was then closed. The substrate was then heated to a temperature of about 500° C. The furnace 9 was heated to 200° C. and then raised to surround the tube region containing the ruthenium source 1.

A smooth adherent coating of metallic ruthenium was formed on the substrate 4 at a rate of about 6 $\mu$m average thickness/h to a final average thickness of 10 $\mu$m.

If the Ru(acac)$_3$ has been prepared sometime ago, e.g., several years ago, the deposit was initially black and did not adhere to the substrate. Provided that all deposition of black deposit was over, if this black coated substrate was replaced by another one, the deposit then obtained was smooth, adherent and metallic.

EXAMPLE 2

This Example compares using the apparatus shown in the accompanying drawing, the results obtained using a static partial vacuum according to the invention, with those obtained by using a dynamic partial vacuum or atmospheric pressure.

Using a static partial vacuum, i.e., one which was not pumped, an initial pressure of 0.4 torr, a Ru(acac)$_3$ source at a temperature of 150° C. and a substrate temperature of about 500° C. produced by radio frequency induction heating, a smooth, adherent metallic coating was produced on a sintered carbide substrate at a rate of about 1 $\mu$m/hour ($\mu$m/h) to a final average thickness of 3 $\mu$m.

In comparison, as an example of the use of a dynamic, i.e., continuously-pumped, partial vacuum, a reaction vessel was continuously pumped at a pressure of less than $10^{-3}$ torr, and a Ru(acac)$_3$ source was found to evaporate under this pressure at temperatures above about 140° C., the evaporation rate being considerable at 160° C. Despite this considerable evaporation rate and using substrate temperatures in the range of from 400° to 600° C., it was not found possible to produce a metallic coating on a sintered carbide substrate.

As an example of atmospheric operation, a Ru(acac)$_3$ source was vaporized at a temperature of from 190° to 200° C. in a flowing hydrogen (100 milliliters per minute, ml/min) carrier gas. The substrate (a sintered carbide tool insert) was heated to about 500° C., and although the coating obtained was bright, clean and metallic, it was only about 0.3 $\mu$m thick after one hour. Furthermore, during this time the source was completely reduced to metallic ruthenium, and so the process was inefficient in its use of the complex. The substrate is, accordingly, given a quicker coating in a static partial vacuum.

EXAMPLE 3

Using the apparatus shown in the accompanying drawing, a Ru (acac)$_3$ solid source at a temperature of 210° C. produced, on a sintered carbide substrate at a temperature of 580° C. and under an initial pressure of $10^{-2}$ torr, a ruthenium coating of average thickness 5 $\mu$m in only 20 minutes, i.e., a coating rate of 15 $\mu$m/h.

EXAMPLE 4

Using the apparatus shown in the accompanying drawing a Ru(CH$_3$.CO.CH.CO.CF$_3$)$_3$ source was used at a temperature of 130° C. The initial pressure in the static vacuum was $10^{-1}$ torr and the temperature of the substrate was about 700° C. A good deposit of ruthenium with an average thickness of 0.8 $\mu$m was produced in 20 minutes, i.e., a rate of 2.4 $\mu$m/h.

EXAMPLE 5

This Example and Example 6 illustrate the reduction in flank wear obtained on tools coated by the process of the present invention, as compared with tools coated by electrodeposition. The coated tools were used to machine work-bars of two steels, designated by British Standard Type Nos. 080 A 40 (formerly called En 8) and 835 M 30 (formerly called En30B). Type 080 A 40 has a composition, in weight %, of 0.4 carbon, 0.05-0.35 silicon, 0.8 manganese, 0.06 sulfur, 0.06 phosphorus, balance iron, and a Hardness-Vickers (Hv) of 175. Type 835 M 30 has a composition, in weight %, of 4.1 nickel, 1.2 chromium, 0.3 molybdenum, 0.3 carbon, 0.1 silicon, 0.5 manganese, 0.05 sulfur, 0.05 phosphorus, balance iron, and a Hardness-Vickers of 500.

The tool used were coated as follows:

A precision ground mixed carbide tool insert of composition WC/TiC/TaNbC/Co, grade P30, was cleaned with carbon tetrachloride and then coated with ruthenium by the process of the invention using the apparatus in the accompanying drawing to an average thickness of 2 $\mu$m using a Ru(acac)$_3$ source at 200° C., a substrate temperature of 600° C. and a pressure of $10^{-2}$ torr. The coated tool was heated treated in vacuum in a graphite boat with a lid, at a temperature of 1325° C. for 1 hour, and allowed to cool.

For comparison, a carbide tool insert of the same composition as used for the chemical vapor deposition was cleaned and electroplated with gold to an average thickness of 1 $\mu$m using a propriety gold cyanide electrolyte and then electroplated with ruthenium to an average thickness of 4 $\mu$m using an electrolyte containing (NH$_4$)$_3$[Ru$_2$NCl$_8$(H$_2$O)$_2$] (30 g/l (grams/liter)) and ammonium sulphamate (10 g/l) at pH 1.8 at a temperature of 70° C. and a cathode current density of 1 A/dm$^2$ (ampere/square decimeter). The electroplated tool was then heat treated as described for the tool coated by chemical vapor deposition.

These type coated inserts were used to machine a work bar of Type 835 M 30 steel and their performance was compared with that of an uncoated tool. The machining conditions were 41 surface meters/minute (mpm), 0.3 millimeters/revolution (mm/rev) and 2.0 millimeters (mm) depth of cut.

The average life of an uncoated insert was about 8 minutes whereas the two coated inserts were still machining after 12 minutes. However, the average flank wear after 12 minutes with the insert coated by the process of the invention was only 0.1 mm, as compared with about 0.45 mm for the electro-coated insert.

Other machining trials were conducted with other inserts of the same composition and coated in the same way but using a cutting speed of 215 mpm and a Type 080 A 40 steel work bar. Here the electro-coated and uncoated inserts both failed after 8 minutes whereas the insert coated by the process of the invention was still cutting after 12 minutes. The flank wear after four minutes as about 0.65 mm on the electro-coated insert and about 0.22 mm on the insert coated by the process of the invention.

EXAMPLE 6

Mixed carbide tool inserts, of composition WC/TiC/TaNbC/Co, grade P10, were coated as described in Example 5 to an average thickness of 3 $\mu$m by the process of the invention and on another insert to an average thickness of 4 $\mu$m by electroplating. Machining tests were conducted on Type 080 A 40 steel work bars under the conditions described in Example 5 but with a cutting speed of 245 mpm.

After 3.3 minutes the insert coated by the present process showed 0.14 mm of flank wear, whereas after only 1.8 minutes the electro-coated insert showed 0.23 mm of flank wear.

These machining tests show clearly the improvement in flank wear, and to some extent the improvement in tool life, produced by coating cutting tools by the process of the present invention.

The foregoing examples show not only the utility of the coating process of the present invention, but, also, the fact that the rate of deposition of ruthenium can be at least 4 $\mu$m or 5 $\mu$m per hour which rate is highly advantageous.

Although the present invention has been described in conjunction with preferred embodiments, it is to be understood that modifications and variations may be restored to without departing from the spirit and scope of the invention, as those skilled in the art will readily understand. Such modifications and variations are considered to be within the purview and scope of the invention and appended claims.

We claim:

1. A process for depositing metallic ruthenium on a hot substrate comprising
   A. providing a solid, sublimable complex of ruthenium with a compound of formula R$_1$—CO—CHR$_2$—CO—R$_3$, wherein each of R$_1$ and R$_3$, which may be the same or different, is an alkyl, haloalkyl, alkoxy, aryl, or alkyl-, nitro-, or halosubstituted aryl group and R$_2$ is a hydrogen atom or an alkyl or haloalkyl group;
   B. subjecting said solid complex of ruthenium to a pressure of less than about 10 torr in a chamber
   C. heating said solid complex of ruthenium in said chamber to a temperature below its melting point to provide in said chamber vapor of said ruthenium complex;
   D. causing said vapor of said ruthenium complex to randomly impact on a substrate in said chamber separately heated to a temperature at which said ruthenium complex decomposes; and
   E. carrying out B, C and D aforesaid while maintaining a substantially constant static partial vacuum in said chamber, whereby vapor of ruthenium complex impacting on the heated substrate is caused to thermally decompose on said substrate to provide on said substrate a rapid build-up of a uniform layer of ruthenium metal.

2. The process as in claim 1 wherein the solid complex ruthenium is ruthenium acetylacetonate, the solid complex is heated to 150° C. to 210° C. and the substrate is at a temperature in the range of 550° C. to 650° C.

3. The process as in claim 1 wherein the solid complex is $Ru(CH_3 CO CH CO CF_3)_3$, the solid complex is heated to 130° C. to 150° C. and the substrate is at a temperature in the range of 700° C. to 750° C.

4. The process as in claim 1 wherein the substrate is a carbide tool insert.

* * * * *